United States Patent
Kawamoto

(10) Patent No.: US 9,153,643 B2
(45) Date of Patent: Oct. 6, 2015

(54) SEMICONDUCTOR CERAMIC AND METHOD FOR MANUFACTURING THE SAME, AND LAMINATED SEMICONDUCTOR CERAMIC CAPACITOR WITH VARISTOR FUNCTION AND METHOD FOR MANUFACTURING THE SAME

(71) Applicant: Murata Manufacturing Co., Ltd., Nagaokakyo-shi, Kyoto-fu (JP)

(72) Inventor: Mitsutoshi Kawamoto, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 195 days.

(21) Appl. No.: 13/873,345

(22) Filed: Apr. 30, 2013

(65) Prior Publication Data

US 2013/0234293 A1    Sep. 12, 2013

Related U.S. Application Data

(63) Continuation of application No. PCT/JP2012/051778, filed on Jan. 27, 2012.

(30) Foreign Application Priority Data

Feb. 3, 2011    (JP) ................................. 2011-021381

(51) Int. Cl.
    *C04B 35/465*    (2006.01)
    *H01G 4/10*    (2006.01)
    (Continued)

(52) U.S. Cl.
    CPC ................ *H01L 28/60* (2013.01); *B28B 11/24* (2013.01); *B82Y 30/00* (2013.01); *C01G 23/006* (2013.01); *C04B 35/47* (2013.01);
    (Continued)

(58) Field of Classification Search
    CPC .......... C04B 35/47; H01G 4/1227; H01G 4/30
    See application file for complete search history.

(56) References Cited

U.S. PATENT DOCUMENTS

| 5,166,759 | A | 11/1992 | Ueno et al. |
| 7,583,493 | B2 * | 9/2009 | Tani et al. ................... 361/321.4 |

(Continued)

FOREIGN PATENT DOCUMENTS

| CN | 1654420 A | 8/2005 |
| JP | 2002134350 | * 5/2002 |

(Continued)

OTHER PUBLICATIONS

International Search Report and Written Opinion, issued in PCT/JP2012/051778, mailed Apr. 17, 2012.

*Primary Examiner* — Karl Group
(74) *Attorney, Agent, or Firm* — Arent Fox LLP

(57) ABSTRACT

A semiconductor ceramic contains a donor element solid-solved in crystal grains of a $SrTiO_3$-based compound, and an acceptor element in a grain boundary layer. The number of tetravalent acceptor elements is $1\times10^{17}$/g or more, as determined from an electron spin resonance absorption spectrum. A mixture of a calcined powder and an acceptor compound is pulverized to a specific surface area of 5.0 to 7.5 $m^2$/g before mixing with a binder. Semiconductor ceramic layers having a varistor function are formed by using the semiconductor ceramic forming a highly reliable capacitor which can suppress characteristics variations to stably obtain good electrical characteristics.

16 Claims, 5 Drawing Sheets

(51) Int. Cl.
    *H01L 49/02*     (2006.01)
    *B82Y 30/00*     (2011.01)
    *C01G 23/00*     (2006.01)
    *C04B 35/47*     (2006.01)
    *C04B 35/626*     (2006.01)
    *H01G 4/12*     (2006.01)
    *H01G 4/30*     (2006.01)
    *B28B 11/24*     (2006.01)

(52) U.S. Cl.
CPC ......... *C04B 35/6261* (2013.01); *H01G 4/1227* (2013.01); *H01G 4/30* (2013.01); *C01P 2006/12* (2013.01); *C01P 2006/40* (2013.01); *C04B 2235/3224* (2013.01); *C04B 2235/3227* (2013.01); *C04B 2235/3241* (2013.01); *C04B 2235/3251* (2013.01); *C04B 2235/3258* (2013.01); *C04B 2235/3262* (2013.01); *C04B 2235/3275* (2013.01); *C04B 2235/3279* (2013.01); *C04B 2235/3281* (2013.01); *C04B 2235/3418* (2013.01); *C04B 2235/36* (2013.01); *C04B 2235/441* (2013.01); *C04B 2235/444* (2013.01); *C04B 2235/483* (2013.01); *C04B 2235/5409* (2013.01); *C04B 2235/5454* (2013.01); *C04B 2235/652* (2013.01); *C04B 2235/6582* (2013.01); *C04B 2235/663* (2013.01); *C04B 2235/786* (2013.01); *C04B 2235/79* (2013.01); *C04B 2235/85* (2013.01)

(56) References Cited

U.S. PATENT DOCUMENTS

| | | | |
|---|---|---|---|
| 7,990,678 | B2 * | 8/2011 | Kawamoto et al. ........ 361/321.4 |
| 8,040,658 | B2 * | 10/2011 | Kawamoto ................. 361/321.1 |
| 8,199,455 | B2 | 6/2012 | Adachi |
| 2007/0273468 | A1 * | 11/2007 | Kang et al. ...................... 338/20 |
| 2008/0117561 | A1 * | 5/2008 | Tani et al. ...................... 361/311 |
| 2010/0103587 | A1 * | 4/2010 | Kawamoto ................. 361/321.1 |
| 2012/0019977 | A1 | 1/2012 | Kawamoto |
| 2014/0210048 | A1 * | 7/2014 | Kawamoto .................... 257/532 |

FOREIGN PATENT DOCUMENTS

| | | |
|---|---|---|
| JP | 2003347147 A | 12/2003 |
| JP | 2011057511 A | 3/2011 |
| JP | 2012028568 A | 2/2012 |
| WO | WO-2008/004389 A1 | 1/2008 |
| WO | WO-2009113475 A1 | 9/2009 |

\* cited by examiner

SEMICONDUCTOR CERAMIC AND METHOD FOR MANUFACTURING THE SAME, AND LAMINATED SEMICONDUCTOR CERAMIC CAPACITOR WITH VARISTOR FUNCTION AND METHOD FOR MANUFACTURING THE SAME

This is a continuation of application Serial No. PCT/JP2012/051778, filed Jan. 27, 2012, the entire contents of which are incorporated herein by reference.

TECHNICAL FIELD

The present invention relates to a semiconductor ceramic and a method for manufacturing the same, and a laminated semiconductor ceramic capacitor with a varistor function and a method for manufacturing the same, and more specifically to a $SrTiO_3$-based grain boundary insulated semiconductor ceramic, a method for manufacturing the semiconductor ceramic, a laminated semiconductor ceramic capacitor with a varistor function using the semiconductor ceramic, and a method for manufacturing the same.

BACKGROUND ART

In recent years, mobile electronic devices such as cellular phones and laptop personal computers, and in-car electronic devices to be installed on cars have become common with the development of electronics technology, and a reduction in size with multi-functionalization has been required for the electronic devices.

On In order to achieve the reduction in size with multi-functionalization for the electronic devices, more semiconductor elements have been used such as various types of ICs and LSI, and accordingly, the electronic devices have decreased the noise immunity.

Conventionally, power lines for semiconductor elements are provided with a film capacitor, a laminated ceramic capacitor, a laminated semiconductor ceramic capacitor, or the like as a bypass capacitor, thereby to ensure the noise immunity for the electronic devices.

In particular, what is commonly the case is that a capacitor with a capacitance on the order of 1 nF is connected to an external terminal, thereby to absorb high-frequency noises in the case of car navigation systems, car audio systems, in-car ECUs, etc.

However, while these capacitors deliver superior performance on the absorption of high-frequency noises, the capacitors themselves do not function to absorb high-voltage pulses or static electricity. For this reason, there is a possibility that the high-voltage pulses or static electricity may cause the electronic device to malfunction or cause the semiconductor elements to be broken if high-voltage pulses or static electricity are input to the electronic devices. Particularly, when the capacitor has a low capacitance on the order of 1 nF, there is a possibility that this may cause the capacitor itself to be broken since an ESD (electro-static discharge) withstand voltage is extremely low (for example, about 2 to 4 kV).

Conventionally, as shown in FIG. 9, it is commonly the case that a bypass capacitor 104 is disposed to a power source line 103 being connected between an external terminal 101 and a semiconductor element 102, and a zener diode 105, for example, is connected to the power source line 103 in parallel to the bypass capacitor 104. The zener diode 105 plays a role in protecting the bypass capacitor 104 and protecting the semiconductor element 102, and thereby, an ESD withstand voltage is ensured to protect the semiconductor element 102.

However, when the zener diode 105 is disposed in parallel to the bypass capacitor 104 as described above, the number of components is increased to cause an increase in cost, and moreover, space for the placement of the components has to be secured, and there is thus a possibility that an increase in the size of the device may result.

A $SrTiO_3$-based grain boundary insulation type laminated semiconductor ceramic capacitor is known to have a varistor characteristic, and has received attention as a countermeasure item for ESD since application of a voltage of a certain level or more allows a large current to flow.

If this type of the laminated semiconductor ceramic capacitor can provide not only the immunity to ESD but also the protection of a semiconductor element 102, only one laminated semiconductor ceramic capacitor 106 can cover these functions in place of the capacitor and zener diode conventionally used as shown in FIG. 10. Thereby, the number of components or cost is reduced, and standardization of design is facilitated, and therefore a capacitor having added values can be provided.

Patent Document 1 proposes a laminated semiconductor ceramic capacitor with a varistor function which includes a laminated sintered body obtained by alternately laminating and firing a plurality of semiconductor ceramic layers formed of a $SrTiO_3$-based grain boundary insulated semiconductor ceramic and a plurality of internal electrode layers, and external electrodes on both ends of the laminated sintered body, the external electrodes electrically connected to the internal electrode layers, wherein the semiconductor ceramic has a compounding molar ratio m of a Sr site to a Ti site satisfying the relational expression $1.000 < m \leq 1.020$, a donor element is solid-solved in crystal grains, the acceptor element is present in a grain boundary layer in the range of 0.5 mol or less (not including 0 mol) with respect to 100 mol of the Ti element, and the average grain diameter of the crystal grains is 1.0 µm or less.

The ceramic raw materials in Patent Document 1 including a donor compound are weighed so as to adjust the compounding molar ratio of a Sr site to a Ti site to a predetermined ratio, mixed/pulverized, then subjected to a calcining treatment at a temperature of 1350° C. to prepare a calcined powder, and the calcined powder and an acceptor compound are wet-mixed/pulverized for 16 hours, and the resulting mixture is heat-treated to prepare a heat-treated powder. Thereafter, the heat-treated powder is subjected to forming process to prepare a ceramic green sheet, internal electrode layers and the ceramic green sheets are alternately laminated to form a laminate, and then the laminate is subjected to a primary firing treatment at a firing temperature of 1250° C. in a reducing atmosphere to be brought into a semiconductor, and the laminate is subjected to a secondary firing treatment in an atmosphere of the air to form a grain boundary insulated layer, and thereafter an external electrode is formed to obtain the laminated semiconductor ceramic capacitor with a varistor function.

In this Patent Document 1, it becomes possible to obtain a laminated semiconductor ceramic capacitor in which an average grain diameter of crystal grains is 1.0 µm or less to allow oxygen to easily go around the grain boundary during secondary firing, and thereby, formation of a Schottky barrier becomes sufficient, the specific resistance is large, and the ESD withstand voltage is as large as 30 kV or more.

Further, the firing temperature in the primary firing treatment in Patent Document 1 is set to a temperature equal to or less than the calcining temperature, and thereby, grain growth of the crystal grain is hardly promoted during the primary firing treatment, and therefore the crystal grain is prevented from becoming large and realizes an average grain diameter of crystal grains of 1.0 µm or less.

PRIOR ART DOCUMENTS

Patent Documents

Patent Document 1: WO 2008/004389 A

DISCLOSURE OF THE INVENTION

Problem to be Solved by the Invention

From the results of investigations of the present inventor, it was found that the electrical characteristics of the products in Patent Document 1 vary largely depended on the properties of a crystal grain boundary, and therefore it is difficult to obtain stable characteristics. That is, the prior art Patent Document 1 has a problem that desired characteristics can be attained when the crystal grain boundary has good properties, but since the electrical characteristics, particularly varistor characteristics, vary largely depending on the properties of the crystal grain boundary, the characteristics vary from product to product, resulting in a reduction of product yield, and the ability of the product to be manufactured in quantity is low.

The present invention was made in view of such a situation, and it is an object of the present invention to provide a highly reliable semiconductor ceramic which can suppress variations in characteristics between products to stably obtain good electrical characteristics and a method for manufacturing the semiconductor ceramic, and a laminated semiconductor ceramic capacitor with a varistor function using the semiconductor ceramic and a method for manufacturing the capacitor.

Means for Solving the Problem

The present inventor made earnest investigations to achieve the above-mentioned object, and consequently obtained findings that a divalent acceptor element is oxidized to become trivalent or tetravalent due to the reoxidation in secondary firing, and when the number of the tetravalent acceptor elements per unit weight (g) in the acceptor elements is larger, the properties of the crystal grain boundary are stabilized to a greater degree, and thereby, the electrical characteristics are stabilized.

Further, a semiconductor ceramic was analyzed by using an electron spin resonance (hereinafter, referred to as "ESR") method, and consequently it was found that by forming a semiconductor ceramic in such a way that when the number of the tetravalent acceptor elements per unit weight (g) in the acceptor elements is $1 \times 10^{17}$/g or more, the properties of the grain boundary layer are stabilized, and thereby, variations in characteristics between products can be suppressed.

The present invention was made based on these findings, and the semiconductor ceramic of the present invention is characterized in that the semiconductor ceramic is a $SrTiO_3$-based grain boundary insulated semiconductor ceramic in which a principal component is formed of a $SrTiO_3$-based compound, a donor element is solid-solved in crystal grains, and an acceptor element is present in a grain boundary layer, and in the acceptor elements, the number of tetravalent acceptor elements per unit weight (g) is $1 \times 10^{17}$/g or more.

Thereby, a stable grain boundary insulated layer can be formed, and a semiconductor ceramic, in which variations in characteristics between products are suppressed and the characteristics are stable, can be obtained with high efficiency.

In the semiconductor ceramic of the present invention, the number of the tetravalent acceptor elements per unit weight (g) is preferably determined from an ESR absorption spectrum, and thereby, the number of the tetravalent acceptor elements per unit weight (g) can be easily determined.

Moreover, the acceptor element is preferably at least one element among Mn, Co, Ni, and Cr in the semiconductor ceramic of the present invention.

Further, the compounding molar ratio m of the Sr site to the Ti site in the semiconductor ceramic of the present invention satisfies the relational expression $0.990 \leq m \leq 1.010$, and the content of the acceptor element is preferably 0.7 mol or less (not including 0 mol) with respect to 100 mol of the Ti element.

Further, the acceptor element is preferably contained in an amount of 0.3 mol to 0.5 mol with respect to 100 mol of the Ti element in the semiconductor ceramic of the present invention.

Still further, the donor element is preferably at least one element selected from La, Nd, Sm, Dy, Nb, and Ta in the semiconductor ceramic of the present invention.

Also, in the semiconductor ceramic of the present invention, a low melting point oxide is preferably contained in an amount of 0.1 mol or less with respect to 100 mol of the Ti element.

Moreover, the low melting point oxide is preferably $SiO_2$.

As a result of the earnest investigations of the present inventor, it was found that when a calcined powder and an acceptor compound are mixed and pulverized before adding a binder, the mixture can be finely pulverized until the specific surface area of the mixture becomes 5.0 to 7.5 $m^2$/g to make the mixed state uniform or approximately uniform, even though thereafter, a binder is added and the resulting mixture is subjected to a series of processing steps, the number of tetravalent acceptor elements per unit weight (g) can be $1 \times 10^{17}$/g or more after reoxidation.

That is, a method for manufacturing a semiconductor ceramic of the present invention is a method for manufacturing a $SrTiO_3$-based grain boundary insulated semiconductor ceramic including a calcined powder preparation step of weighing a Sr compound, a Ti compound and a donor compound in predetermined amounts, mixing/pulverizing these compounds, and then calcining the resulting powder to prepare a calcined powder; a mixed powder preparation step of weighing the calcined powder and an acceptor compound in predetermined amounts, mixing/pulverizing these compounds, and then heat-treating the resulting mixture to prepare a mixed powder; a binder mixing step of mixing a binder with the mixed powder to prepare a ceramic slurry; a forming step of preparing a formed product from the ceramic slurry; and a firing step of subjecting the formed product to a primary firing treatment in a reducing atmosphere, and then to a secondary firing treatment in an atmosphere of the air to prepare a sintered body, wherein the mixture of the calcined powder and the acceptor compound is pulverized so as to have the specific surface area of the mixed powder of 5.0 to 7.5 $m^2$/g in the mixed powder preparation step.

The acceptor compound and the calcined powder are thereby mixed uniformly or approximately uniformly, and therefore the oxidation of the acceptor element is promoted in the secondary firing and the number of tetravalent acceptor elements per unit weight (g) can be $1 \times 10^{17}$/g or more. Accordingly, it is possible to manufacture a stable semiconductor ceramic in which variations in characteristics are suppressed, and improve the ability of the semiconductor ceramic to be manufactured in quantity.

When the firing temperature in the primary firing treatment is preferably set to a temperature of 1150 to 1250° C., the calcining temperature is preferably set to a temperature of 1300 to 1450° C., and since the firing temperature is set to a temperature lower than the calcining temperature, the grain growth of crystal grains can be suppressed to allow oxygen to easily go around the grains during secondary firing, and thereby, formation of a Schottky barrier is promoted to improve insulating properties.

In the method for manufacturing a semiconductor ceramic of the present invention, it is preferred that in the firing step, the firing temperature in the primary firing treatment is set to a temperature lower than the calcining temperature in the calcined powder preparation step to fire the formed product.

Further, it is preferred in the method for manufacturing a semiconductor ceramic of the present invention that in the calcined powder preparation step, the calcining temperature is set to a temperature of 1300 to 1450° C. to perform the calcining treatment, and in the firing step, the firing temperature in the primary firing treatment is set to a temperature of 1150 to 1250° C. to perform the firing treatment.

A laminated semiconductor ceramic capacitor with a varistor function (hereinafter, referred to as a "laminated semiconductor ceramic capacitor") of the present invention is a laminated semiconductor ceramic capacitor comprising a laminated sintered body obtained by alternately laminating and sintering a plurality of semiconductor ceramic layers and a plurality of internal electrode layers, and external electrodes on both ends of the laminated sintered body, the external electrodes electrically connected to the internal electrode layers, wherein the semiconductor ceramic layer is formed of the semiconductor ceramic according to any of the above descriptions.

Further, a method for manufacturing a laminated semiconductor ceramic capacitor of the present invention is a method for manufacturing a $SrTiO_3$-based grain boundary insulation type laminated semiconductor ceramic capacitor including a calcined powder preparation step of weighing a Sr compound, a Ti compound and a donor compound in predetermined amounts, mixing/pulverizing these compounds, and then calcining the resulting powder to prepare a calcined powder; a mixed powder preparation step of weighing the calcined powder and an acceptor compound in predetermined amounts, mixing/pulverizing these compounds, and then heat-treating the resulting mixture to prepare a mixed powder; a binder mixing step of mixing a binder with the mixed powder to prepare a ceramic slurry; a forming step of subjecting the ceramic slurry to forming process to prepare a ceramic green sheet, applying a conductive paste onto the ceramic green sheet to form a conductive film, and laminating the conductive film and the ceramic green sheet alternately to prepare a laminated formed product; and a firing step of subjecting the laminated formed product to a primary firing treatment in a reducing atmosphere, and then to a secondary firing treatment in an atmosphere of the air to prepare a sintered body, wherein a mixture of the calcined powder and the acceptor compound is pulverized so as to have the specific surface area of the mixed powder of 5.0 to 7.5 $m^2/g$ in the mixed powder preparation step.

As described above, since the above-mentioned semiconductor ceramic and the method for manufacturing the semiconductor ceramic in the present invention are used to obtain a laminated semiconductor ceramic capacitor, a highly reliable laminated semiconductor ceramic capacitor having a varistor function, in which variations in characteristics between products are suppressed, can be obtained with high efficiency, and the laminated semiconductor ceramic capacitor is suitable for mass production.

Moreover, it is preferred that in the method for manufacturing a laminated semiconductor ceramic capacitor of the present invention, the firing temperature in the primary firing treatment is set to a temperature lower than the calcining temperature in the calcined powder preparation step to fire the formed product.

Further, it is preferred that in the calcined powder preparation step, the calcining temperature is set to a temperature of 1300 to 1450° C. to perform the calcining treatment, and in the firing step, the firing temperature in the primary firing treatment is set to a temperature of 1150 to 1250° C. to perform the firing treatment.

Effects of the Invention

In accordance with the semiconductor ceramic of the present invention, a stable grain boundary insulated layer can be formed, and a semiconductor ceramic in which variations in characteristics between products are suppressed and the characteristics are stable, can be obtained with high efficiency since the semiconductor ceramic is a $SrTiO_3$-based grain boundary insulated semiconductor ceramic in which a principal component is formed of a $SrTiO_3$-based compound, a donor element is solid-solved in crystal grains, and an acceptor element is present in a grain boundary layer, and since in the above-mentioned acceptor elements, the number of tetravalent acceptor elements per unit weight (g) is $1 \times 10^{17}$/g or more.

In accordance with the method for manufacturing a semiconductor ceramic of the present invention, since in the mixed powder preparation step, a mixture of the calcined powder and the acceptor compound is pulverized so as to have the specific surface area of the mixed powder of 5.0 to 7.5 $m^2/g$, the acceptor compound and the calcined powder are mixed uniformly or approximately uniformly, the oxidation of the acceptor element is promoted in the secondary firing treatment, and the number of tetravalent acceptor elements per unit weight (g) can be $1 \times 10^{17}$/g or more. Accordingly, it is possible to manufacture a stable semiconductor ceramic in which variations in characteristics are suppressed, and improve the ability of the semiconductor ceramic to be manufactured in quantity.

Further, since the above-mentioned semiconductor ceramic and the method for manufacturing the semiconductor ceramic are used, a highly reliable laminated semiconductor ceramic capacitor having a varistor function, in which variations in characteristics between products are suppressed, can be obtained with high efficiency, and the laminated semiconductor ceramic capacitor is suitable for mass production.

BEST MODE FOR CARRYING OUT THE INVENTION

Next, an embodiment of the present invention will be described in detail.

Figure 1:
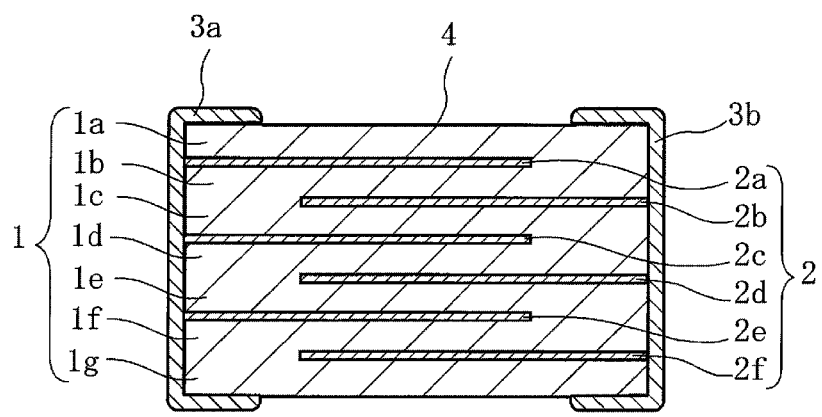
FIG. 1 is a cross-sectional view schematically showing an embodiment of a laminated semiconductor ceramic capacitor of the present invention.

FIG. 1 is a cross-sectional view schematically showing an embodiment of a laminated semiconductor ceramic capacitor of the present invention.

The laminated semiconductor ceramic capacitor includes a component body 4 and external electrodes 3a and 3b formed on both ends of the component body 4.

The component body 4 is made of a laminated sintered body having a plurality of semiconductor ceramic layers 1a to 1g and a plurality of internal electrode layers 2a to 2f stacked alternately, and the internal electrode layers 2a, 2c, and 2e are exposed at one end surface of the component body 4 and electrically connected to one external electrode 3a, whereas the other internal electrode layers 2b, 2d, and 2f are exposed at the other end surface of the component body 4 and electrically connected to the other external electrode 3b.

While the conductive material to be used for internal electrode layers 2a to 2f is not particularly limited, any base metal material predominantly composed of Ni, Cu or the like, which is inexpensive and has good conductivity, is preferably used.

In the semiconductor ceramic layers 1a to 1g, the principal component is composed of a $SrTiO_3$-based material, a donor element is solid-solved in crystal grains, and an acceptor element is present in a grain boundary layer. That is, the semiconductor ceramic layers 1a to 1g are composed of an aggregate of a crystal grain made of a semiconductor and a grain boundary layer formed around the crystal grain, and crystal grains form a capacitance with the grain boundary layer interposed therebetween. The semiconductor ceramic layers 1a to 1g are connected to one another in series or in parallel between opposed surfaces of internal electrode layers 2a, 2c, 2e and internal electrode layers 2b, 2d, 2f, and thereby, a desired capacitance is attained as a whole.

In the semiconductor ceramic layers 1a to 1g, the number of tetravalent acceptor elements per unit weight (g) in the acceptor elements is adapted to be $1 \times 10^{17}$/g or more.

That is, the ceramic in this type of the semiconductor ceramic layers 1a to 1g is brought into a semiconductor condition by a primary firing treatment in a reducing atmosphere, and subsequently the grain boundary layer is brought into an insulation condition by a secondary firing treatment in an atmosphere of the air, and thereby, a grain boundary insulated layer is formed. Further, the acceptor element is allowed to be present in the grain boundary insulated layer, and thereby, the grain boundary insulated layer forms an energy level (grain boundary level) which is electrically activated to promote the formation of a Schottky barrier, and therefore insulation resistance can be improved.

By the way, in the semiconductor ceramic, in general, a material having a divalent acceptor element such as $Mn^{2+}$ or the like is used as an acceptor raw material. A divalent acceptor element is oxidized to become trivalent or tetravalent by the secondary firing treatment. However, when the amount of the trivalent acceptor element is large, since reoxidation is insufficient, the properties of the grain boundary layer lack the stability. Therefore, the varistor characteristic varies from product to product, and consequently the immunity to ESD tends to vary, and therefore it is difficult to stably obtain a semiconductor ceramic having good characteristics.

When the amount of the tetravalent acceptor element is large, reoxidation is adequately performed to adequately insulate the grain boundary, and therefore the properties of the grain boundary layer are stabilized to allow electrical characteristics to be stable, and thereby, it becomes possible to have a varistor characteristic in which variations in characteristics are suppressed between products and to obtain reliability that immunity to ESD is excellent.

To that end, the number of tetravalent acceptor elements per unit weight (g) needs to be $1 \times 10^{17}$/g or more. For example, when Mn is used as the acceptor element, Mn, which is divalent before secondary firing, becomes trivalent or tetravalent as a consequence of the reoxidation treatment in the secondary firing.

When the number of $Mn^{4+}$ per unit weight (g) is less than $1 \times 10^{17}$/g, reoxidation is not adequately performed to comparatively increase the number of $Mn^{3+}$, and therefore, there is a possibility that the properties of the grain boundary layer may become unstable and variations in varistor characteristic may be produced between products, resulting in a reduction of product yields and a failure in obtaining a laminated semiconductor ceramic capacitor having good reliability.

On the other hand, when the number of $Mn^{4+}$ per unit weight (g) is $1 \times 10^{17}$/g or more, reoxidation is adequately performed to stabilize the properties of the grain boundary layer, and thereby, it is possible to obtain a highly reliable semiconductor ceramic having a good varistor characteristic in which variations in characteristics between products are suppressed and capable of stably ensuring a sufficient ESD withstand voltage.

The molar content of the acceptor element is not particularly limited, but when the molar content is more than 0.7 mol with respect to 100 mol of the Ti element, it is not preferred since a reduction in an ESD withstand voltage is caused.

Therefore, the molar content of the acceptor element may be preferably 0.7 mol or less (however, not including 0 mol), and more preferably 0.3 to 0.5 mol with respect to 100 mol of the Ti element.

Further, such the acceptor element is not particularly limited, and Co, Ni, and Cr can be used other than Mn described above, for example.

By using an ESR method, the valence of the acceptor element can be identified, and the number of the acceptor elements can be determined.

In accordance with the ESR method, if an unpaired electron is placed in a sweep magnetic field H, energy which a spin has is split by Zeeman splitting. When the magnetic field H is swept while irradiating a sample with a microwave having a constant frequency ν, a resonance phenomenon occurs when satisfying a mathematical formula (1) and ESR absorption is observed.

$$h\nu = g\beta H \tag{1}$$

wherein h is a Planck's constant, β is a Bohr magneton, g is a spectroscopic splitting constant (hereinafter, referred to as a "g factor").

That is, the g factor is a substance-specific value and represents a position of a resonant magnetic field. Accordingly, the number of valences of an acceptor element in the sample can be identified from a value of the g factor corresponding to a peak of absorption intensity on the ESR absorption spectrum.

Further, since the absorption intensity of the ESR absorption spectrum is proportional to the number of unpaired electrons, the number of the acceptor element can be calculated from the ratio between a value of integral of an absorption curve and a value of integral of an absorption curve of a reference substance (for example, $CuSO_4 \cdot 5H_2O$) in which the spin quantum number is known.

In order to attain the number of tetravalent acceptor elements per unit weight (g) of $1 \times 10^{17}$/g or more, it is necessary to mix the calcined powder and the acceptor compound uniformly or approximately uniformly, and to that end, as described later, it is necessary to previously mix and pulverize a mixture of the calcined powder and the acceptor compound until the specific surface area of the mixture becomes 5.0 to 7.5 $m^2$/g before adding a binder.

In accordance with the semiconductor ceramic of the present embodiment as described above, the properties of the grain boundary layer are stabilized, and thereby, a semiconductor ceramic in which variations in characteristics between products are suppressed and the characteristics are stable can be obtained with high efficiency since in the acceptor elements, the number of tetravalent acceptor elements per unit weight (g) is $1 \times 10^{17}$/g or more.

A laminated semiconductor ceramic capacitor manufactured by using the above-mentioned semiconductor ceramic becomes a highly reliable capacitor in which varistor characteristics and immunity to ESD are stable.

Further, since the above laminated semiconductor ceramic capacitor can performs the functions of a capacitor and a zener diode in a single element, the number of components or cost can be reduced, and standardization of design is facilitated, and therefore a laminated semiconductor ceramic capacitor of high added value can be realized.

In addition, the compounding molar ratio m of the Sr site to the Ti site in the present embodiment is preferably adjusted so as to satisfy the relational expression $0.990 \leq m \leq 1.010$.

That is, by containing Sr in excess of stoichiometric composition, the Sr which is deposited in the crystal grain boundary without being solid-solved in the crystal suppresses the grain growth, and therefore fine crystal grains are obtained. Since the crystal grain becomes fine, oxygen easily goes around the a crystal grain boundary, and therefore the formation of a Schottky barrier is promoted and good insulation resistance can be ensured.

However, when the compounding molar ratio is more than 1.010, since the precipitation of Sr not solid-solved in the crystal grain on the grain boundary is increased to excessively increase the thickness of the grain boundary insulating layer, and there is a possibility that an excessive reduction in the capacitance may be caused.

When the Ti is in excess of the stoichiometric composition, the insulation resistance which can be adequately used practically without causing variations between products can be ensured although the crystal grain becomes larger slightly and insulation resistance tends to decease, and further a good ESD withstand voltage can be maintained.

When the compounding molar ratio m is less than 0.990, the average grain diameter of the crystal grains becomes excessively large, thereby resulting in a significant decrease in insulating property, and moreover, in a decrease in ESD withstanding voltage.

Accordingly, the compounding molar ratio m is preferably adjusted so as to satisfy the relational expression $0.990 \leq m \leq 1.010$.

The donor element is allowed to be solid-solved in the crystal grains in order to bring the ceramic into a semiconductor by the firing treatment in a reducing atmosphere described above, and the content of the donor element is not particularly limited. However, when the donor element is less than 0.2 mol with respect to 100 mol of the Ti element, there is a possibility that an excessive reduction in the capacitance may be caused. On the other hand, when the donor element is greater than 1.2 mol with respect to 100 mol of the Ti element, there is a possibility that this may cause the allowable temperature range for the firing temperature to be narrowed.

Therefore, the molar content of the donor element may be 0.2 mol to 1.2 mol, and preferably 0.4 mol to 1.0 mol with respect to 100 mol of the Ti element.

Such the donor element is not particularly limited, and for example, La, Nd, Sm, Dy, Nb, and Ta can be used.

The average grain diameter of the crystal grains of the semiconductor ceramic is preferably 1.5 µm or less.

When the average grain diameter of the crystal grains is more than 1.5 µm, the average grain diameter is too large and oxygen hardly goes around it during secondary firing, and there is a possibility that formation of a Schottky barrier may be insufficient to cause insulation resistance to deteriorate.

It is also preferable to add a low melting point oxide to the semiconductor ceramic 1 in an amount of 0.1 mol or less with respect to 100 mol of the Ti element, and the addition of this type of low melting point oxide can improve the sinterability, and promote the segregation of the acceptor element in the grain boundary.

In addition, the molar content of the low melting point oxide was set to the range mentioned above because the molar content greater than 0.1 mol with respect to 100 mol of the Ti element may possibly lead to an excessive reduction in capacitance, thereby resulting in a failure to achieve desired electrical characteristics.

In this case, the low melting point oxide is not particularly limited, $SiO_2$, glass-ceramic containing B or an alkali metal element (such as K, Li, and Na), copper-tungsten salts, etc. can be used, and among these, $SiO_2$ is preferably used.

Next, an embodiment will be described with reference to a method for manufacturing the laminated semiconductor ceramic capacitor.

First, as ceramic raw materials, a Sr compound such as $SrCO_3$ or the like, a donor compound containing a donor element such as La, Sm or the like, and a Ti compound having a fine particle size, for example, $TiO_2$ having a specific surface area of 10 $m^2$/g or more (average grain diameter: about 0.1 µm or less) are respectively prepared, and weighed in a predetermined amount.

Then, a predetermined amount (for example, 1 to 3 parts by weight) of a dispersant is added to these weighed materials, and then the resulting mixture is charged into a ball mill with a pulverizing medium such as PSZ (partially stabilized zirconia) balls and pure water, and adequately wet-mixed in the ball mill to prepare a slurry.

Next, the slurry is evaporated to dryness, and then subjected to a calcination treatment at a predetermined temperature (for example, 1300° C. to 1450° C.) for about 2 hours in the atmosphere of the air to prepare a calcined powder having a donor element solid-solved (the calcined powder preparation step).

Then, a predetermined amount of an acceptor compound containing an acceptor element such as Mn, Co or the like is weighed, and a predetermined amount of a low melting point oxide such as $SiO_2$ is weighed as required. The acceptor compound and low melting point oxide are mixed with the calcined powder, and pure water and an organic dispersant are added, and the resulting mixture is charged into a ball mill again with the pulverizing medium and adequately wet-mixed/pulverized for a predetermined time (for example, 24 to 36 hours) in the ball mill. Thereafter, the resulting mixture is evaporated to dryness, and then heat-treated at a predetermined temperature (for example, 500° C. to 700° C.) for about 5 hours in and air atmosphere to remove an organic component or the like contained in the dispersant and prepare a mixed powder having fine particle size with a specific surface area of 5.0 to 7.5 m$^2$/g (the mixed powder preparation step).

Next, appropriate amounts of pure water and an organic dispersant are added to the mixed powder, and the resulting mixture is adequately wet-mixed again in a ball mill. Thereafter, an organic binder and a surfactant are appropriately added, and the resulting mixture is adequately wet-mixed to obtain a ceramic slurry (binder mixing step).

It is not preferred to add the binder when mixing the calcined powder and the acceptor compound. That is, when the binder is added to a mixture of the calcined powder and the acceptor compound, it becomes difficult to make the mixed state uniform or approximately uniform even though the mixture is finely pulverized until the specific surface area of the mixture becomes 5.0 to 7.5 m$^2$/g since the mixture is affected by the binder. Therefore, reoxidation in the secondary firing is insufficient so as to increase the possibility that a divalent acceptor element exists in a trivalent state without being oxidized to a tetravalent acceptor element, and there is a possibility that the number of tetravalent acceptor elements per unit weight (g) is less than $1 \times 10^{17}$/g.

Next, the ceramic slurry is subjected to forming process by using a forming processing method such as a doctor blade method, a lip coater method, or a die coater method to prepare a ceramic green sheet having a predetermined thickness.

Then, a conductive paste for internal electrodes is transferred onto the ceramic green sheet by using a screen printing method, a gravure printing method, a vacuum deposition method, or a sputtering method, thereby forming a conductive film with a predetermined pattern on the surface of the ceramic green sheet.

Next, a plurality of ceramic green sheets having the conductive films formed thereon are laminated in a predetermined direction, ceramic green sheets for the outer layers not having conductive films formed is laminated thereon, and then the laminated ceramic green sheets are pressure bonded, and cut into a predetermined dimension to prepare a laminate (the forming step).

Thereafter, the laminate is subjected to a debinder treatment at a temperature of 300 to 500° C. for about 2 hours in a nitrogen atmosphere. Subsequently, the laminate is subjected to primary firing at a temperature of 1150 to 1250° C. for about 2 hours to be brought into a semiconductor in a firing furnace brought into a reducing atmosphere, in which a ratio between H$_2$ gas flow rate and N$_2$ gas flow rate is adjusted to a predetermined value (for example, H$_2$/N$_2$=0.025/100 to 1/100).

By setting a firing temperature (1150 to 1250° C.) in the primary firing treatment to a temperature lower than a calcining temperature (1300 to 1450° C.) in the calcining treatment as described above, grain growth of the crystal grain is hardly promoted during the primary firing treatment, and therefore the crystal grain is prevented from becoming larger and an average grain diameter of crystal grains can be 1.5 μm or less.

After thus bringing the laminate into a semiconductor condition, a secondary firing is carried out at a low temperature of 600 to 900° C. for about 1 hour in an atmosphere of the air to reoxidize the semiconductor ceramic, and thereby, a component body 4 composed of a laminated sintered body having an internal electrode 2 embedded is prepared (the firing step).

Next, a conductive paste for external electrodes is applied onto both ends of the component body 4, and subjected to a firing treatment to form the external electrodes 3a and 3b, thereby producing a laminated semiconductor ceramic capacitor.

As a method for forming the external electrodes 3a and 3b, printing, vacuum deposition, sputtering, or the like may be used. In addition, the conductive paste for external electrodes may be applied onto the both ends of the unfired laminate, and then subjected to a firing treatment at the same time as the laminate.

While the conductive material contained in the conductive paste for external electrodes is not particularly limited, it is preferred to use a material such as Ga, In, Ni, and Cu, and further, it is also possible to form an Ag electrode on these electrodes.

In the present embodiment described above, since in the mixed powder preparation step, the calcined powder, the acceptor compound and the low melting point oxide are mixed and pulverized until the specific surface area of a mixture becomes 5.0 to 7.5 m$^2$/g or more without adding a binder, the mixed state can be made uniform or approximately uniform, and the reoxidation is promoted by the secondary firing treatment in the subsequent firing treatment, and the number of tetravalent acceptor elements per unit weight (g) can be $1.0 \times 10^{17}$/g or more. As a result of this, a highly reliable semiconductor ceramic in which variations in varistor characteristics or variations in immunity to ESD are suppressed, and hence a laminated semiconductor ceramic capacitor having excellent reliability can be stably obtained, and a manufacturing method suitable for mass production can be realized.

In addition, the present invention is not limited to the embodiment described above. For example, while the solid solution is prepared by a solid phase method in the present embodiment, the method for preparing the solid solution is not particularly limited, and any methods can be employed, such as a hydrothermal synthesis method, a sol-gel method, a hydrolysis method, and a coprecipitation method.

Next, examples of the present invention will be described specifically.

EXAMPLES

Preparation of Sample

Sample No. 1

As ceramic raw materials, SrCO$_3$, TiO$_2$ having a specific surface area of 30 m$^2$/g (average grain diameter: about 30 nm), and LaCl$_3$ as a donor compound were prepared. Then, LaCl$_3$ was weighed in such a way that the content of La was 0.8 mol with respect to 100 mol of the Ti element, and further SrO$_3$ and TiO$_2$ were weighed in such a way that the compounding molar ratio m of a Sr site to a Ti site (=Sr site/Ti site) was 1.000.

Three parts by weight of ammonium polycarboxylate were added to 100 parts by weight of these weighed materials as a dispersant, and then the resulting mixture was charged into a ball mill with PSZ balls of 2 mm in diameter as a pulverizing medium and pure water, and subjected to wet mixing for 16 hours in the ball mill to prepare a slurry.

Next, this slurry was evaporated to dryness, and then subjected to a calcination treatment at a temperature of 1400° C.

for 2 hours in the atmosphere of the air to obtain a calcined powder with La solid-solved in crystal grains (a calcined powder preparation step).

Next, $MnCO_3$ was added to the calcined powder in such a way that the content of Mn element as an acceptor element was 0.3 mol with respect to 100 mol of the Ti element, and further $SiO_2$ was added to the calcined powder in such a way that the content of Si element was 0.1 mol with respect to 100 mol of the Ti element, and further a dispersant was added to the calcined powder in such a way that the content of the dispersant was 1% by weight. The resulting mixture was charged into a ball mill again with PSZ balls of 2 mm in diameter and pure water, and wet-mixed/pulverized for 24 hours in the ball mill. In addition, $MnO_3$ was added to the calcined powder in the present example, but a $MnCl_2$ solution or a Mn sol solution may be added. Further, $SiO_2$ was added to the calcined powder, but tetraethoxysilane ($Si(OC_2H_5)_4$) or the like may be added.

Thereafter, the resulting mixture was evaporated to dryness, and then heat-treated at a temperature of 500° C. for 5 hours in the atmosphere of the air to remove any organic component such as the dispersant and obtain a mixed powder (a mixed powder preparation step).

Next, pure water and a dispersant were added to the mixed powder in an appropriate amount, and the resulting mixture was charged into a ball mill again with PSZ balls of 2 mm in diameter, and wet mixed for 4 hours in the ball mill. Thereafter, a water-soluble acrylic binder as an organic binder and a plasticizer, and further a surfactant were added in an appropriate amount, and wet-mixed for 1.5 hours to prepare a ceramic slurry.

Next, the ceramic slurry was subjected to forming process by a lip coater method and a ceramic green sheet was prepared so as to have a semiconductor ceramic layer thickness of 25 μm after firing. Then, a conductive paste for internal electrodes predominantly composed of Ni was used to be applied onto the ceramic green sheet by screen printing, thereby forming a conductive film with a predetermined pattern on the surface of the ceramic green sheet.

A predetermined number of ceramic green sheets having the conductive films formed thereon were laminated in the predetermined direction, and then a ceramic green sheet for outer layers not having conductive films formed thereon, and placed on each of the top and a bottom surfaces, and the laminated ceramic green sheets were subjected to thermo-compression bonding so as to have a thickness of about 0.5 mm in the subsequent process to obtain a block body in which the ceramic green sheets and internal electrodes were alternately laminated to each other. Thereafter, the block body was cut into a piece with a predetermined dimension to form a laminate (a forming step).

The laminate was subjected to a debinder treatment at a temperature of 400° C. for 2 hours in a nitrogen atmosphere, and subsequently subjected to primary firing at a temperature of 1210° C. for 2 hours in a reducing atmosphere composed of $H_2$ flow and $N_2$ flow adjusted in proportions of 1:100 to be brought into a semiconductor.

Next, a secondary firing was carried out at a temperature of 700° C. for 1 hour in an air atmosphere to reoxidize the semiconductor ceramic, and thereby, oxygen was dispersed in the grain boundary to form a grain boundary insulated layer, and then an end face was polished to prepare a component body (a firing step).

Then both end faces of the component body were sputtered to form an external electrode having a three-layer structure composed of a Ni—Cr layer, a Ni—Cu layer and an Ag layer. Electrolytic plating was applied to form a Ni film and a Sn film sequentially on the surfaces of the external electrodes, thereby preparing samples of sample No. 1 having a capacitance of about 1 nF. The outer dimension of each of the obtained samples was 1.0 mm in length L, 0.5 mm in width W, and 0.5 mm in thickness T, and the effective number of laminated semiconductor ceramic layers was 10.

Sample No. 2

Samples of sample No. 2 having a capacitance of about 1 nF were prepared by the same method/procedure as in the sample No. 1 except for changing the mixing/pulverizing time in the mixed powder preparation step to 36 hours. The effective number of laminated semiconductor ceramic layers was 10 as with the sample No. 1.

Sample No. 3

Samples of sample No. 3 having a capacitance of about 1 nF were prepared by the same method/procedure as in the sample No. 1 except for changing the mixing/pulverizing time in the mixed powder preparation step to 16 hours. The effective number of laminated semiconductor ceramic layers was 10 as with the sample No. 1.

Sample No. 4

A calcined powder preparation step was performed by the same method/procedure as in the sample No. 1 to obtain a calcined powder.

Next, a dispersant was added to the calcined powder in such a way that the content of the dispersant was 1% by weight, and then the resulting mixture was charged into a ball mill again with PSZ balls of 2 mm in diameter and pure water, and wet-pulverized for 24 hours in the ball mill. Thereafter, the resulting slurry was discharged and evaporated to dryness, and then heat-treated at a temperature of 500° C. for 5 hours to remove any organic component such as the dispersant and obtain a pulverized powder of the calcined material (a calcined powder pulverizing step).

$MnCO_3$ was added to the mixed powder in such a way that the content of Mn element was 0.3 mol with respect to 100 mol of the Ti element, and $SiO_2$ was added to the pulverized powder of the calcined material in such a way that the content of Si element was 0.1 mol with respect to 100 mol of the Ti element, and further appropriate amounts of pure water and a dispersant were added, and the resulting mixture was charged into a ball mill again with PSZ balls of 2 mm in diameter, and wet-mixed for 4 hours in the ball mill. Thereafter, a water-soluble acrylic binder as an organic binder, and further a surfactant were added in an appropriate amount, and the resulting mixture was wet-mixed for 1.5 hours to prepare a ceramic slurry (a binder preparation step).

Samples of sample No. 4 having a capacitance of about 1 nF were prepared by the same method/procedure as in the sample No. 1. The effective number of laminated semiconductor ceramic layers was 10 as with the sample No. 1.

Evaluations of Samples

The specific surface area of each of samples of sample Nos. 1 to 3 was measured by the BET method at the point of obtaining a mixed powder. Further, the specific surface area of a pulverized powder of the calcined material was measured for samples of sample No. 4.

Circular plate samples were also prepared separately, and the number of $Mn^{4+}$s contained in the semiconductor ceramic was determined by using an ESR method.

That is, first, the predetermined number of the ceramic green sheets prepared in the sample Nos. 1 to 4 were laminated, and subjected to thermocompression bonding so as to have a thickness of about 0.5 mm, and punched out into a circular plate to prepare a formed product.

Next, the prepared formed products were fired under the same conditions as in the sample No. 1 to obtain circular plate samples of sample Nos. 1 to 4, having a diameter of 5 mm and a thickness of 0.5 mm, for measurement of ESR absorption spectrum.

Then, using an ESR apparatus (EMX manufactured by BRUKER Corporation), an ESR absorption spectrum was measured while irradiating a sample obtained by pulverizing the circular plate sample with a microwave of X-band (frequency: 9.5 GHz).

Figure 2:
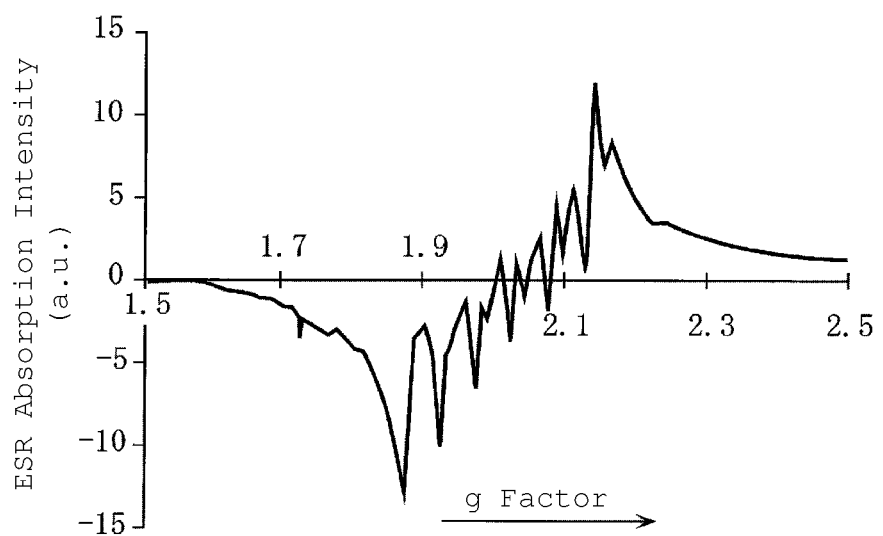
FIG. 2 is an ESR absorption spectrum of a sample No. 1 in examples.
Figure 3:
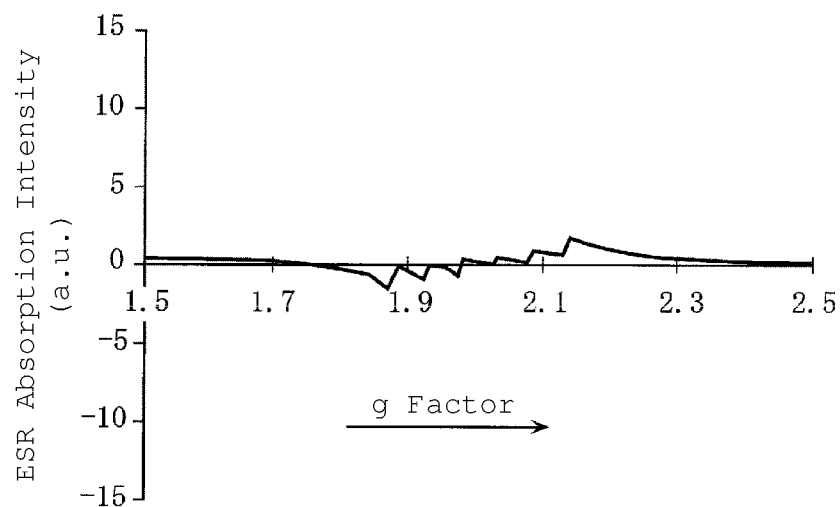
FIG. 3 is an ESR absorption spectrum of a sample No. 3 in examples.
Figure 4:
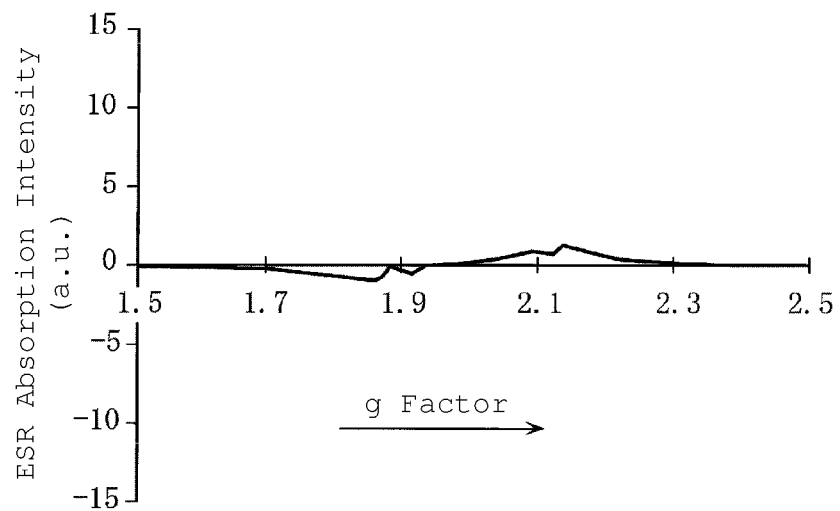
FIG. 4 is an ESR absorption spectrum of a sample No. 4 in examples.

FIG. 2 shows the ESR absorption spectrum of a sample No. 1, FIG. 3 shows the ESR absorption spectrum of a sample No. 3, and FIG. 4 shows the ESR absorption spectrum of a sample No. 4. In these drawings, a horizontal axis is a g factor (−), and a vertical axis shows an ESR absorption intensity (a.u.).

In the case of the sample Nos. 3 and 4, as is apparent from FIG. 3 and FIG. 4, it was found that a peak of the absorption intensity at the g factor indicating an absorption position was small, and the number of $M^{4+}$s was small.

In the case of the sample No. 1, as shown in FIG. 2, it was found that a peak of the absorption intensity at the g factor indicating an absorption position was large, and the number of $M^{4+}$s was large.

In sample No. 2, not shown, the approximately same absorption spectrum as in the sample No. 1 was obtained.

Next, values of integral of the ESR absorption spectrums of these sample Nos. 1 to 4 were determined. The absorption spectrum of $CuSO_4.5H_2O$ used as a standard sample was measured and a value of integral thereof was determined.

The number of $Mn^{4+}$s was calculated based on a ratio between these values of integral, spin quantum number of the standard sample and the number of unpaired electrons of $Mn^{4+}$.

One hundred samples for each of the sample Nos. 1 to 4 were respectively positively and negatively charged ten times and discharged by contact, and subjected to an ESD breakdown test at 30 kV according to IEC61000-4-2 (International Standard) which is an immunity test standard of ESD.

Table 1 shows manufacturing conditions and measured results in each sample of the sample Nos. 1 to 4. In addition, the Table shows the pulverizing time in the calcined powder pulverizing step described in a field of the mixing/pulverizing time in the mixed powder preparation step in the sample No. 4.

In the case of the sample No. 4, 35 samples among 100 samples were broken in the ESD breakdown test at 30 kV although the mixing/pulverizing time in the mixed powder preparation step is as long as 24 hours, and therefore the specific surface area of the pulverized powder of the calcined material was as large as 5.1 $m^2/g$. The reason for this is probably that since $MnCO_3$ and $SiO_2$ were added in the binder mixing step, the Mn component could not be mixed uniformly or approximately uniformly in the calcined powder because of the effect of the binder, and therefore reoxidation was not adequately performed in secondary firing to unstabilize properties of the grain boundary layer resulting in a reduction of a product yield.

In the case of the sample Nos. 1 and 2, on the other hand, since $MnCO_3$ and $SiO_2$ were added in the mixed powder preparation step and the mixing/pulverizing time was as long as 24 to 36 hours, the specific surface area of the mixed powder was 5.3 to 7.4 $m^2/g$, and therefore the mixture was finely and uniformly or approximately uniformly mixed/pulverized, and reoxidation was adequately performed during secondary firing, and therefore the number of $Mn^{4+}$ per unit weight (g) was $2.8 \times 10^{17}/g$ to $4.8 \times 10^{17}/g$ which were larger than $1.0 \times 10^{17}/g$, and there is no sample which was broken in the ESD breakdown test at 30 kV.

Next, the applied voltage was varied stepwise from 1V to 100 V with respect to 20 samples for each of the sample Nos. 1 to 4, and the current value for the applied voltage was measured, and thereby a voltage-current characteristic was determined and a varistor characteristic was evaluated.

Figure 5:
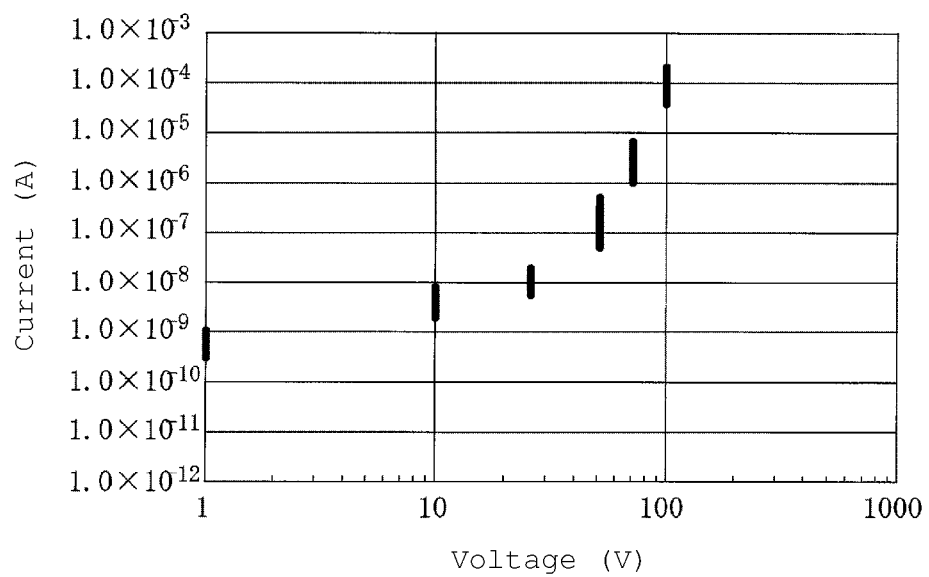
FIG. 5 is a current-voltage characteristic chart of the sample No. 1 in examples.
Figure 6:
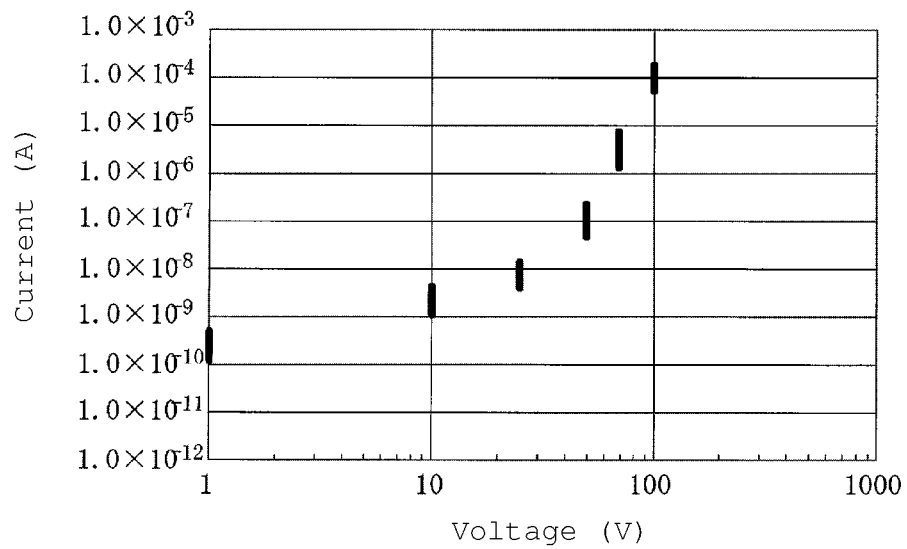
FIG. 6 is a current-voltage characteristic chart of the sample No. 2 in examples.
Figure 7:
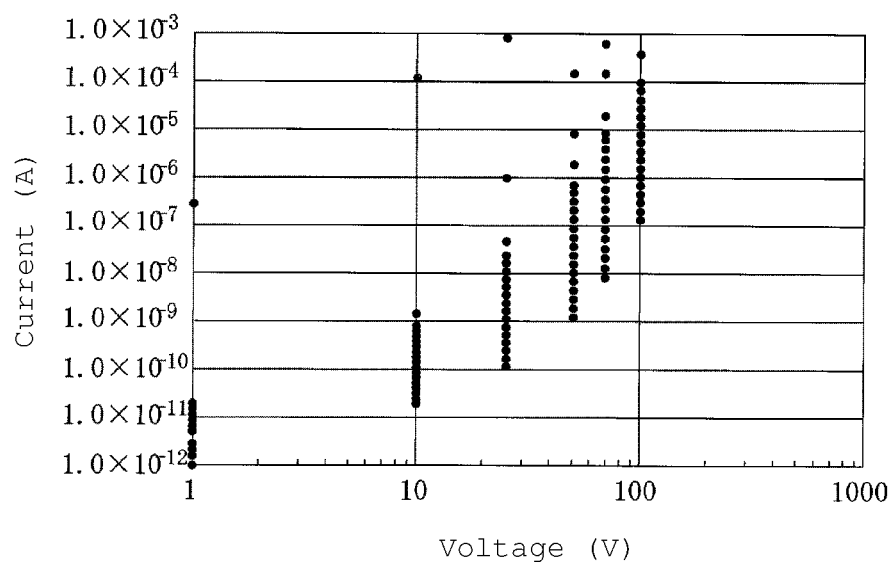
FIG. 7 is a current-voltage characteristic chart of the sample No. 3 in examples.
Figure 8:
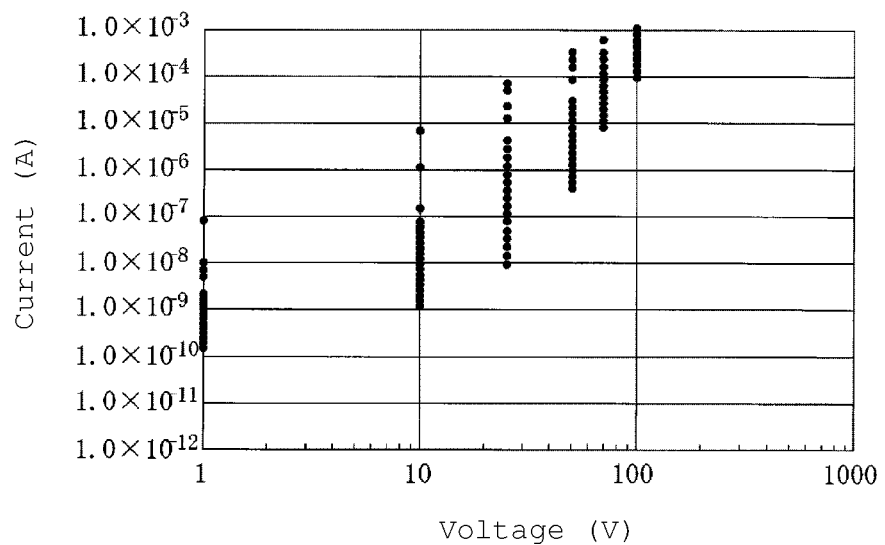
FIG. 8 is a current-voltage characteristic chart of the sample No. 4 in examples.
Figure 9:
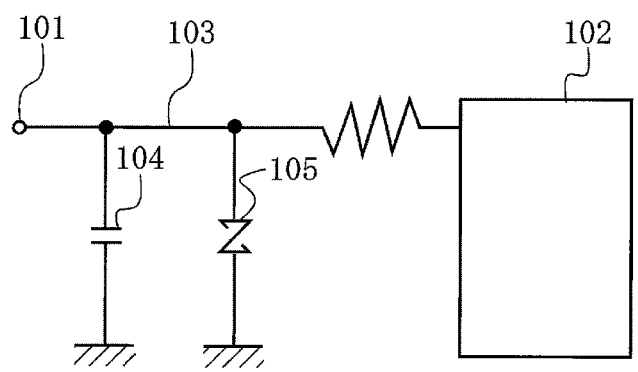
FIG. 9 is an electric circuit diagram in the case where a zener diode is connected in parallel to a bypass capacitor disposed to a power source line.
Figure 10:
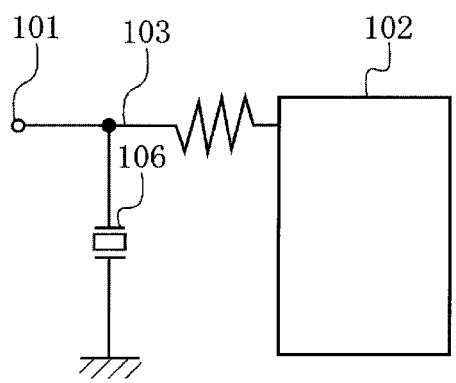
FIG. 10 is an electric circuit diagram in the case where a laminated semiconductor ceramic capacitor is connected to the power source line.

FIG. 5 shows a voltage-current characteristic of the sample No. 1, FIG. 6 shows a voltage-current characteristic of the sample No. 2, FIG. 7 shows a voltage-current characteristic of the sample No. 3, and FIG. 8 shows a voltage-current characteristic of the sample No. 4. In these drawings, a horizontal axis shows voltage (V), and a vertical axis shows current (A).

In the case of the sample Nos. 3 and 4, as shown in FIG. 7 and FIG. 8, variations of the current value on the applied voltage were large, and a stable varistor characteristic could not be achieved.

On the other hand, it was found that variations of the current value on the applied voltage were small in the case of

TABLE 1

| Sample No. | Mixed Powder Preparation Step | | Binder Mixing Step Addition of $MnCO_3$, $SiO_2$ | Specific Surface Area ($m^2/g$) | Number of $Mn^{4+}$ ($Mn^{4+}/g$) | Number of Failures in ESD Breakdown Test |
|---|---|---|---|---|---|---|
| | Addition of $MnCO_3$, $SiO_2$ | Mixing/ Pulverizing Time (hr) | | | | |
| 1 | yes | 24 | No | 5.3 | $2.8 \times 10^{17}$ | 0 |
| 2 | yes | 36 | No | 7.4 | $4.8 \times 10^{17}$ | 0 |
| 3* | yes | 16 | No | 4.2 | $4.5 \times 10^{16}$ | 28 |
| 4* | no | 24 | Yes | 5.1 | $9.5 \times 10^{15}$ | 35 |

*outside the scope of the present invention

In the case of the sample No. 3, the number of $Mn^{4+}$ per unit weight (g) was as small as $4.5 \times 10^{16}/g$ although $MnCO_3$ and $SiO_2$ were added in the mixed powder preparation step, and 28 samples among 100 samples were broken in the ESD breakdown test at 30 kV. The reason for this is probably that since the mixing/pulverizing time was as short as 16 hours, the specific surface area of the mixed powder was as small as 4.2 $m^2/g$, and therefore the mixture was not sufficiently mixed/pulverized to a uniform or approximately uniform state, resulting in insufficient reoxidation in secondary firing.

the sample Nos. 1 and 2, as shown in FIG. 5 and FIG. 6, and a stable varistor characteristic which can be used practically could be achieved.

INDUSTRIAL APPLICABILITY

It becomes possible to realize a highly reliable laminated semiconductor ceramic capacitor with a varistor function in which variations in characteristics between products are small and varistor characteristics are excellent, and one element can serve as both of a capacitor and a zener diode.

DESCRIPTION OF REFERENCE SYMBOLS 1a to 1g semiconductor ceramic layer
2a to 2f internal electrode layer
3a, 3b external electrode
4 component body (laminated sintered body)

The invention claimed is:

1. A semiconductor grain boundary insulated semiconductor ceramic comprising a principal component which is a SrTiO$_3$-based compound, a donor element solid-solved in crystal grains, and an acceptor element present in a grain boundary layer, and in which the number of tetravalent acceptor elements per unit weight (g) is $1\times10^{17}$/g or more.

2. The semiconductor ceramic according to claim 1, where the number of the tetravalent acceptor elements per unit weight (g) is $2.8\times10^{17}$/g or more.

3. The semiconductor ceramic according to claim 1, where the acceptor element is at least one element selected from the group consisting of Mn, Co, Ni, and Cr.

4. The semiconductor ceramic according to claim 3, wherein compounding molar ratio m of Sr site to Ti site is 0.990 m 1.010, and the content of the acceptor element is greater than 0 mol to 0.7 mol or less with respect to 100 mol of the Ti element.

5. The semiconductor ceramic according to claim 4, wherein the acceptor element amount of 0.3 to 0.5 mol with respect to 100 mol of the Ti element.

6. The semiconductor ceramic according to claim 5, wherein the donor element is at least one element selected from the group consisting of La, Nd, Sm, Dy, Nb, and Ta.

7. The semiconductor ceramic according to claim 6, wherein the donor element amount is 0.2 to 1.2 mol with respect to 100 mol of the Ti element.

8. The semiconductor ceramic according to claim 6, wherein the donor element amount is 0.4 to 1 mol with respect to 100 mol of the Ti element.

9. The semiconductor ceramic according to claim 6, containing a low melting point oxide in an amount of 0.1 mol or less with respect to 100 mol of the Ti element.

10. The semiconductor ceramic according to claim 9, wherein the low melting point oxide is SiO$_2$.

11. A laminated semiconductor ceramic capacitor with a varistor function comprising a sintered body comprising a plurality of semiconductor ceramic layers; a plurality of internal electrode layers, each of which is sandwiched by a pair of semiconductor ceramic layers; and a pair of external electrodes on the laminated sintered body, each member of the pair of the external electrodes being electrically connected to different internal electrode layers; wherein the semiconductor ceramic layers comprise a semiconductor ceramic according to claim 1.

12. A laminated semiconductor ceramic capacitor with a varistor function comprising a sintered body comprising a plurality of semiconductor ceramic layers; a plurality of internal electrode layers, each of which is sandwiched by a pair of semiconductor ceramic layers; and a pair of external electrodes on the laminated sintered body, each member of the pair of the external electrodes being electrically connected to different internal electrode layers; wherein the semiconductor ceramic layers comprise a semiconductor ceramic according to claim 2.

13. A laminated semiconductor ceramic capacitor with a varistor function comprising a sintered body comprising a plurality of semiconductor ceramic layers; a plurality of internal electrode layers, each of which is sandwiched by a pair of semiconductor ceramic layers; and a pair of external electrodes on the laminated sintered body, each member of the pair of the external electrodes being electrically connected to different internal electrode layers; wherein the semiconductor ceramic layers comprise a semiconductor ceramic according to claim 4.

14. A laminated semiconductor ceramic capacitor with a varistor function comprising a sintered body comprising a plurality of semiconductor ceramic layers; a plurality of internal electrode layers, each of which is sandwiched by a pair of semiconductor ceramic layers; and a pair of external electrodes on the laminated sintered body, each member of the pair of the external electrodes being electrically connected to different internal electrode layers; wherein the semiconductor ceramic layers comprise a semiconductor ceramic according to claim 7.

15. A laminated semiconductor ceramic capacitor with a varistor function comprising a sintered body comprising a plurality of semiconductor ceramic layers; a plurality of internal electrode layers, each of which is sandwiched by a pair of semiconductor ceramic layers; and a pair of external electrodes on the laminated sintered body, each member of the pair of the external electrodes being electrically connected to different internal electrode layers; wherein the semiconductor ceramic layers comprise a semiconductor ceramic according to claim 9.

16. A laminated semiconductor ceramic capacitor with a varistor function comprising a sintered body comprising a plurality of semiconductor ceramic layers; a plurality of internal electrode layers, each of which is sandwiched by a pair of semiconductor ceramic layers; and a pair of external electrodes on the laminated sintered body, each member of the pair of the external electrodes being electrically connected to different internal electrode layers; wherein the semiconductor ceramic layers comprise a semiconductor ceramic according to claim 10.

* * * * *